(12) United States Patent
Boeckmann et al.

(10) Patent No.: US 6,184,666 B1
(45) Date of Patent: *Feb. 6, 2001

(54) BUCK CONVERTER WITH PARALLEL SWITCHES

(75) Inventors: Eduard F. Boeckmann, Huntsville; Wolfgang F. Dietz, Gurley, both of AL (US)

(73) Assignee: 3DLabs Inc. Ltd., Hamilton (BM)

( * ) Notice: This patent issued on a continued prosecution application filed under 37 CFR 1.53(d), and is subject to the twenty year patent term provisions of 35 U.S.C. 154(a)(2).

Under 35 U.S.C. 154(b), the term of this patent shall be extended for 0 days.

(21) Appl. No.: 09/259,202

(22) Filed: Mar. 1, 1999

Related U.S. Application Data

(60) Provisional application No. 60/077,256, filed on Mar. 9, 1998.

(51) Int. Cl.⁷ .................. G05F 1/40; G05F 1/44
(52) U.S. Cl. ............ 323/282; 323/271; 323/351
(58) Field of Search ..................... 323/282, 271, 323/224, 222, 351

(56) References Cited

U.S. PATENT DOCUMENTS

| | | | |
|---|---|---|---|
| 5,616,945 | * | 4/1997 | Williams ............................ 257/365 |
| 5,663,635 | * | 9/1997 | Vinciarelli et al. .................. 323/282 |
| 5,886,508 | * | 3/1999 | Jutras ................................... 323/267 |
| 5,919,262 | * | 7/1999 | Kikinis et al. ....................... 323/282 |
| 5,929,692 | * | 7/1999 | Carsten ............................... 327/531 |
| 5,932,995 | * | 8/1999 | Wagoner .............................. 323/282 |
| 5,994,885 | * | 11/1999 | Wilcox et al. ........................ 323/285 |

* cited by examiner

*Primary Examiner*—Peter S. Wong
*Assistant Examiner*—Bao Q. Vu
(74) *Attorney, Agent, or Firm*—Groover & Associates; Robert Groover; Betty Formby

(57) ABSTRACT

A converter for reducing the amplitude of a DC input signal includes first and second switches that each are coupled between an input port for receiving the input signal, and voltage reducing circuitry for reducing the amplitude of the input signal. The two switches are configured so that at least one of the switches is open at all times, thus reducing the heat generated by either one of the switches. This consequently reduces the need for heat dissipation devices such as, for example, conventional heat sinks. Moreover, the two switches each may be smaller than that which would be used if a single switch were used since their duty cycles are much smaller than that of such single switch. The converter further includes an output port coupled to the voltage reducing circuitry for providing an output signal having an amplitude that is less than that of the input signal.

15 Claims, 4 Drawing Sheets

US 6,184,666 B1

BUCK CONVERTER WITH PARALLEL SWITCHES

PRIORITY

This application claims priority from U.S. provisional patent application Ser. No. 60/077,256, filed Mar. 9, 1998, entitled "MULTIPLE SWITCH BUCK CONVERTER" and bearing attorney docket number 1247/186, the disclosure of which is incorporated herein, in its entirety, by reference.

FIELD OF THE INVENTION

The invention generally relates to power converters and, more particularly, the invention relates to multiple switch buck converters.

BACKGROUND OF THE INVENTION

Integrated circuits and other circuit elements within electronic devices commonly require an input voltage that is smaller than that supplied by a regulated D.C. power source. For example, an integrated circuit within a computer system may require a powering voltage of about 2.5 volts D.C. from a standard 3.3 volt regulated D.C. source. To that end, voltage regulators have been developed that reduce an input D.C. voltage to a preselected, lower voltage.

Many such prior art regulators, such as linear converters, have a relatively low efficiency (i.e., between about fifty and sixty five percent) when used in high current applications. Accordingly, when used in high current applications, linear converters typically require relatively large heat sinks to dissipate a large amount of heat produced by the voltage reduction process. This heat loss necessarily increases the operating cost of such converters. Moreover, the requirement of a heat sink increases the size and manufacturing cost of each converter.

The art has responded to this efficiency problem by providing switching voltage converters ("buck converters") that dissipate minimal heat in high current (as well as low current) applications. Accordingly, buck converters typically operate at efficiencies of between about seventy and ninety-five percent. Buck converters typically utilize an inductor and a switch that cooperate to reduce the input voltage to a preselected output voltage. The duty cycle of the switch in buck converters, however, can be greater than about ninety percent. This causes the switch to generate excessive heat, especially when used in high current applications. Accordingly, a large switch with a relatively large heat sink often is utilized to dissipate the excess heat. This necessarily increases the cost associated with producing and operating such buck converters.

SUMMARY OF THE INVENTION

In accordance with one aspect of the invention, a converter for reducing the amplitude of a DC input signal includes first and second switches that each are coupled between an input port for receiving the input signal, and voltage reducing circuitry for reducing the amplitude of the input signal. The two switches are configured so that at least one of the two switches is open at least part of the time that the other is closed, thus reducing the heat generated by either one of the switches. For example, if the switches each open and close once in a preselected time interval, one switch may be open for a first half of that time interval while the other switch may be open for the second half of that time interval. This consequently reduces the need for heat dissipation devices such as, for example, conventional heat sinks. Moreover, the two switches each may be smaller than that which would be used if a single switch were used since their duty cycles are much smaller than that of such single switch. The converter further includes an output port coupled to the voltage reducing circuitry for providing an output signal having an amplitude that is less than that of the input signal.

In accordance with other aspects of the invention, the first switch has a first duty cycle of about fifty percent, and the second switch has a second duty cycle that does not exceed fifty percent. The converter further includes buck conversion circuitry with an inductor for receiving current from one of the first switch and the second switch. In other embodiments, the converter includes an input port filter for filtering noise from the input signal, and an output port filter for filtering noise from the output signal. In other embodiments, the switch is a transistor. In still other embodiments, the converter includes control circuitry for controlling the closing of both the first switch and the second switch.

In accordance with other aspects of the invention, the first duty cycle and the second duty cycle are different. Moreover, the first switch closes at a first time and the second switch opens at a second time, where the first time and the second time are substantially the same time. In still other aspects of the invention, the first duty cycle is out of phase with the second duty cycle. In preferred embodiments, the first duty cycle is greater than about ninety degrees out of phase with the second duty cycle. In yet other aspects of the invention, the first switch is closed at a first frequency and the second switch is closed at a second frequency, where the first frequency is different from the second frequency.

BRIEF DESCRIPTION OF THE DRAWINGS

The foregoing and other objects and advantages of the invention will be appreciated more fully from the following further description thereof with reference to the accompanying drawings wherein.

DESCRIPTION OF PREFERRED EMBODIMENTS

Figure 1:
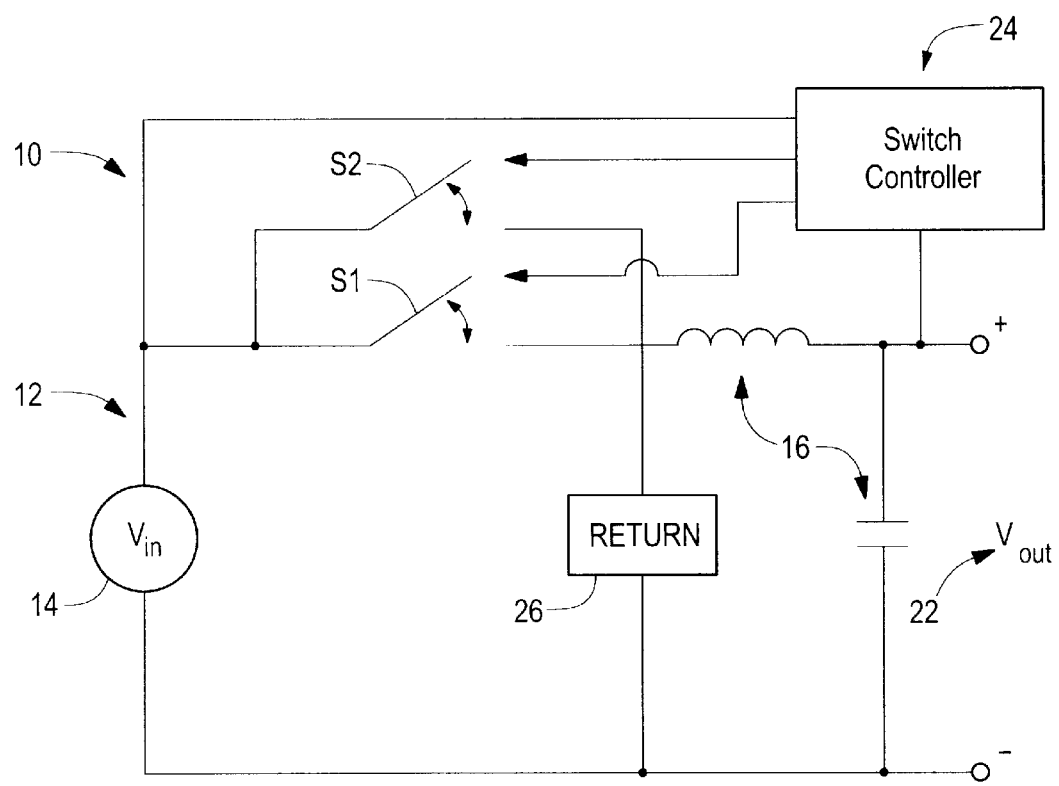
FIG. 1 schematically shows a buck converter with two switches configured in accordance with preferred embodiments of the invention.

FIG. 1 schematically shows a preferred switching voltage converter ("converter 10") that efficiently reduces the amplitude of an input D.C. voltage signal. In accordance with a preferred embodiment of the invention, the converter 10 (a/k/a a "buck converter") includes an input port 12 for receiving an input voltage signal 14, voltage reducing circuitry 16 (shown schematically as an inductor and a capacitor) for both reducing the amplitude of the input voltage signal 14 and filtering switching noise, first and second switches S1 and S2 coupled between the input port 12 and the voltage reducing circuitry 16, and an output port 22 for providing the reduced output voltage signal. A switch controller 24 (discussed in detail below) also is included to control the on/off cycle of the switches S1 and S2. The converter 10 also preferably includes return circuitry 26 for providing a current return path within the converter circuit.

In accordance with preferred embodiments of the invention, the switch controller 24 controls the switches S1 and S2 to switch on (i.e., close) and off (ie., open) in a manner that enables the converter 10 to have effective duty cycles of up to one hundred percent while limiting the duty cycles of each switch S1 and S2 to no greater than fifty percent. This reduces the heat generated by either switch S1 or S2, thus reducing (and often eliminating) the need for a heat sink on either switch. Accordingly, the switches S1 and S2 may be relatively small. In preferred embodiments, the switches S1 and S2 are N-channel MOSFET transistor switches, available from Motorola Inc. of Phoenix, Ariz. In alternative embodiments, the switches S1 and S2 may be bipolar junction transistors, or other types of field effect transistors (e.g., P-channel MOSFETs).

Figure 2:
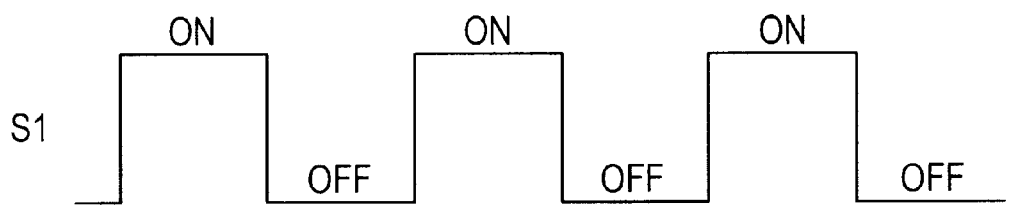
FIG. 2 graphically shows a preferred on/off cycle of the switches in the buck converter shown in FIG. 1.

The switch controller 24 may be a newly configured combination of those conventionally known in the art. For example, in preferred embodiments, the switch controller 24 is configured to set the maximum duty cycle and period of both switches S1 and S2 to be about fifty percent and about five microseconds, respectively. As shown in FIG. 2, the switches S1 and S2 preferably are set so that the first switch S1 turns on at substantially the same time that the second switch S2 turns off (i.e., about 180 degrees out of phase). In a similar manner, the switches S1 and S2 also preferably are set (by the switch controller 24) so that the first switch S1 turns on at substantially the same time that the second switch S2 turns off. Accordingly, although 180 degrees out of phase, the period of each cycle of the first switch S1 is substantially the same as that of the second switch S2. When the switches S1 and S2 are set as such (i.e., as shown in FIG. 2), the converter 10 has a duty cycle of about one hundred percent while neither of the switches S1 and S2 has a duty cycle that is greater than about fifty percent.

The switch controller 24 preferably monitors the input voltage signal 14 at the input port 12, the output voltage signal at the output port 22 (i.e., with or without a load), and the currents through the switches S1 and S2 and the inductor to effectively control the duty cycles of the switches S1 and S2. The switches S1 and S2 consequently are switched on and off based upon these monitored values. In some embodiments, the switch controller 24 includes programmable elements (not shown) that may be programmed to set the duty cycles of each switch S1 and S2. In other embodiments, the switch controller 24 may have separate controlling circuitry for each switch S1 and S2. For example, first switching circuitry for the first switch S1 may set the duty cycle of the first switch S1 to be a first preselected value (e.g., about fifty percent) while second switching circuitry for the second switch S2 may set the duty cycle of the second switch S2 to another, smaller preselected value (e.g., below fifty percent). In yet other embodiments, the second switching circuitry may be a feedback circuit that dynamically modifies the duty cycle of the second switch S2 to ensure that the converter 10 has a predetermined duty cycle. In preferred embodiments, the switch controllers are constant frequency switching regulators (such as model number MC34165 controllers, available from Motorola Inc.) that are configured to perform the desired switch controlling function.

Figure 3:
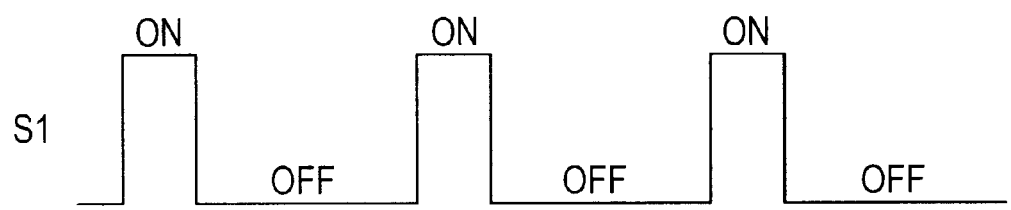
FIG. 3 graphically shows another preferred on/off cycle of the switches in the buck converter shown in FIG. 1.

FIG. 3 shows another preferred on/off cycle of the switches S1 and S2 shown in FIG. 1. In a manner similar to the on/off cycle shown in FIG. 2, the switch controller 24 is configured so that at least one of the first and second switches S1 and S2 is off while the converter 10 is operating (i.e., receiving an input voltage signal 14 at the input port 12), and so that neither of the two switches S1 and S2 is on at the same time. This may be efficiently accomplished when the first switch S1 is turned on as the second switch S2 is turned off. Unlike that shown in FIG. 2, however, the duty cycle of the first switch S1 is smaller than the duty cycle of the second switch S2, which is maintained at fifty percent. The first switch S1 thus turns off before the second switch S2 turns on. Accordingly, the total duty cycle of the converter 10 is the sum of the duty cycle of the first and second switches S1 and S2 since at all times in the converter duty cycle, no more than one of the switches S1 and S2 is on.

Figure 4:
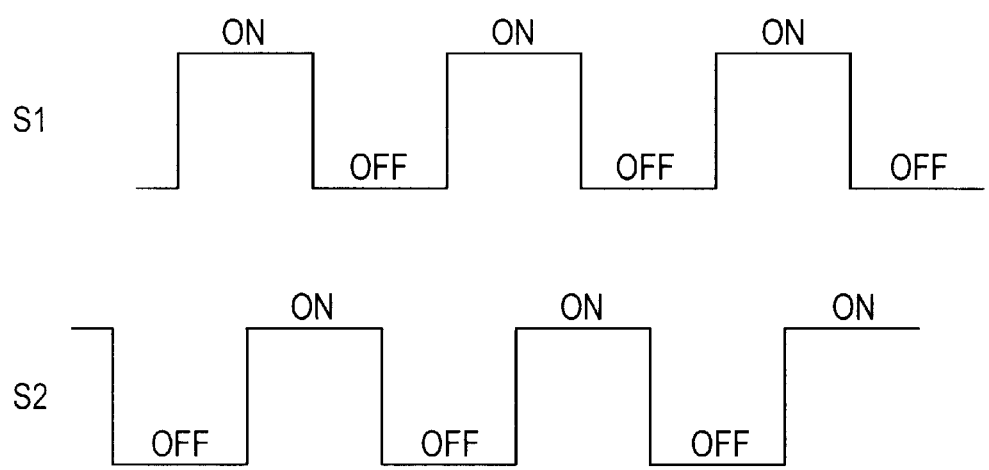
FIG. 4 graphically shows yet another preferred on/off cycle of the switches in the buck converter shown in FIG. 1.

The total duty cycle of the converter 10, however, is not the sum of the two duty cycles if the two switches S1 and S2 are simultaneously on at some time in the on/off cycle. In such case, the total converter duty cycle is less than that of the sum of the two duty cycles of the switches S1 and S2. FIG. 4 shows one such embodiment in which the on/off cycles are out of phase and the duty cycles of both switches S1 and S2 are substantially identical. In a manner similar to that shown in FIGS. 2 and 3, however, the duty cycle of each switch S1 and S2 is smaller than that of the entire converter 10.

In alternative embodiments, the respective frequencies of the on/off cycles of the first and second switches S1 and S2 may be different. Results are expected to be better, however, when the on/off cycle frequencies are substantially the same and synchronized to a constant phase. In the embodiments shown, the duty cycles of the first and second switches S1 and S2 may be manipulated to provide a converter duty cycle that is greater than either of the duty cycles of the two switches S1 and S2. For example, the duty cycle of each switch S1 and S2 may be controlled to be less than sixty percent while the duty cycle of the converter 10 can be higher. As another example, the duty cycle of each switch S1 and S2 can be controlled to be less than ninety-nine percent while the duty cycle of the converter 10 is one hundred percent.

Figure 5:
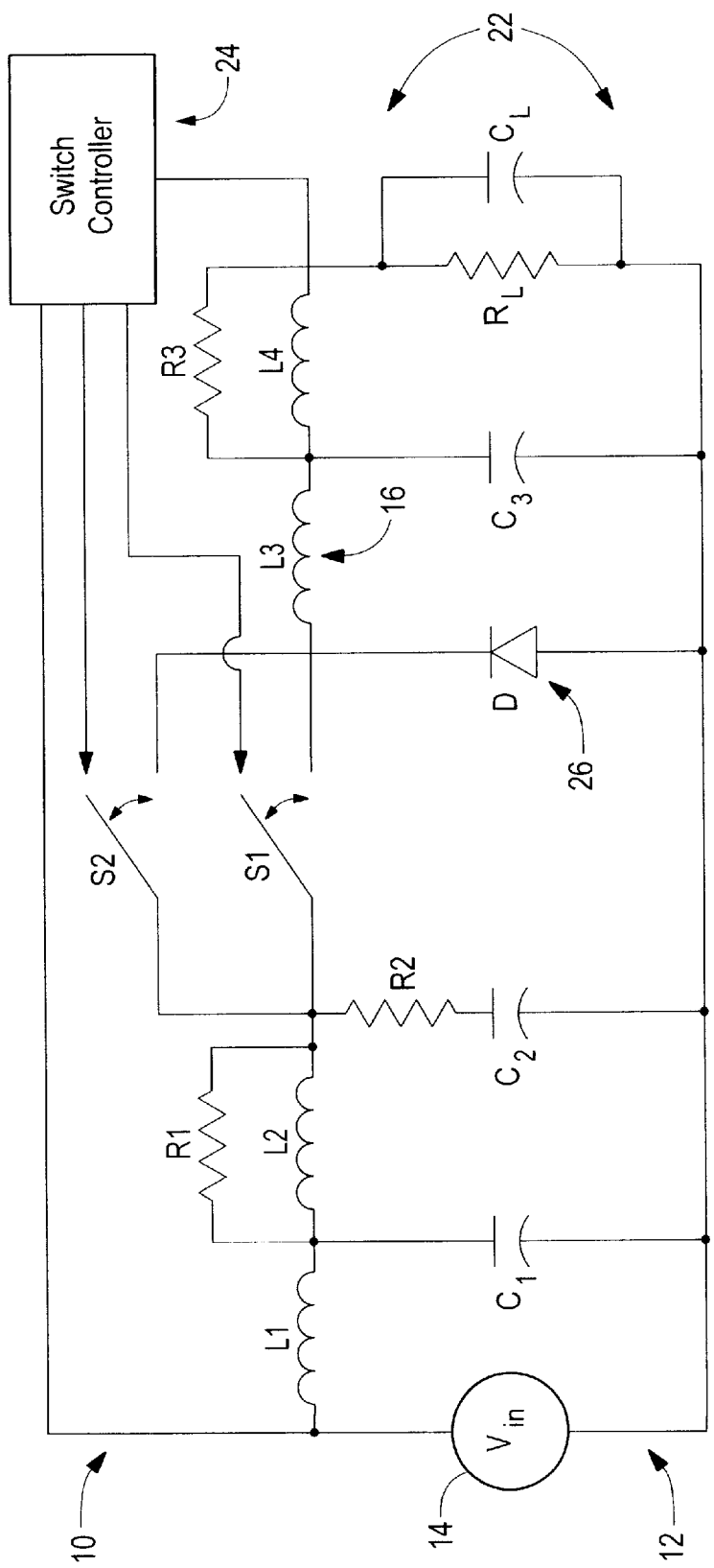
FIG. 5 schematically shows the buck converter shown in FIG. 1 with additional filtering and voltage reducing circuitry.

FIG. 5 schematically shows the converter 10 shown in FIG. 1 with additional filtering and voltage reducing circuitry 16. More particularly, the converter 10 includes a first inductor L1 and a first capacitor C1 that together remove both noise received by the input port 12, and noise resulting from reflections when the switches S1 and S2 are closed and opened. The converter 10 further includes a first resistor R1 and a second inductor L2 that remove high frequency noise (i.e., above about 100 megahertz) in the converter 10 that the first capacitor cannot remove. A second capacitor C2 and a second resistor R2 also may be included to further filter noise. Accordingly, the first and second capacitors C1 and C2, the first and second inductors L1 and L2, and the first and second resistors R1 and R2, cooperate to form an effective RLC filter that removes noise from the input port 12 and noise produced by the switches S1 and S2. Moreover, the effective RLC filter has been tested and determined to lower electromagnetic interference in the converter 10. A large capacitor (e.g., a 200 microfarad capacitor) may be used to provide energy storage, and to handle high levels of RMS current produced by the switches at the input.

The voltage reducing circuitry 16 preferably includes a third inductor L3 that is charged and discharged accordingly to the switching duty cycle of the first and second switches S1 and S2. In addition to the effective RLC filter for the input port 12 (discussed above), the converter 10 further includes a third resistor R3, a fourth inductor L4, and a third capacitor C3 that together form an RLC filter for filtering the output voltage signal. The values of the first and third resistors R1 and R3 preferably are selected to be relatively high (on the order of about 100 ohms) to absorb and dissipate high frequency noise as heat. In addition, reflections from the opening and closing of the switches S1 and S2 also are filtered from the output signal by such filter.

In alternative embodiments that are utilized with currents of less than three amps, a ferrite bead is used instead of the resistor and inductor. A load resistor and load capacitor are schematically shown to represent resistance and capacitance of a load that may be coupled to the output port 22. A diode D also is coupled between the switches S1 and S2 and one lead of the output port 22 to act as the return circuitry 26 for providing a current return path within the converter circuit. Alternatively, a MOSFET switch may be coupled between the switches S1 and S2 to obtain synchronous operation. A third switch (not shown) also may be added in place of the diode D or in parallel with the diode D to improve efficiency. Such third switch is on during the off portion of the converter duty cycle. Accordingly, efficiency is improved since the third switch has a lower voltage drop than that of the diode D.

Preferred element values of the resistors, capacitors, and inductors are as follows:
first resistor: 100 ohms;
second resistor: 0.125 ohms;
third resistor: 100 ohms;
first capacitor: 200 microfarads;
second capacitor: 10 microfarads;
third capacitor: 10 microfarads;
first inductor: 5 nanohenries;
second inductor: 15 nanohenries;
third inductor: 2.2 microhenries; and
forth inductor: 50 nanohenries.

It should be noted that many of the elements shown in FIG. 5 are not necessary for implementing the invention. For example, the filtering elements may be omitted without departing from the scope of the invention. In addition, although coupled in parallel in the figures, the switches S1 and S2 may include additional elements that do not produce an exact parallel combination of switches S1 and S2, as shown. For example, a resistor may be added in series with one of the switches S1 and S2 for current limiting purposes. It also should be noted that when describing the converter 10, two circuit elements may be considered to be "coupled" even if other circuit elements are connected between such two elements.

In computer simulations, a converter was tested having the elements shown in FIG. 5 and a 0.22 ohm load. The duty cycle of such converter 10 was determined to be about ninety-one percent, while the duty cycle of the first switch S1 was about fifty percent and the duty cycle of the second switch S2 was about forty-one percent. In this case, the on/off cycles of both switches S1 and S2 were aligned in a substantially identical manner to that shown in FIG. 3.

Accordingly, when utilized in accordance with a preferred embodiment of the invention, the duty cycle of the converter 10 is higher than that of either one of the switches S1 and S2. The switches S1 and S2 thus are relatively small and should not require a heat sink to dissipate excess generated heat. This necessarily decreases manufacturing and operating costs of the converter 10.

Although various exemplary embodiments of the invention have been disclosed, it should be apparent to those skilled in the art that various changes and modifications can be made which will achieve some of the advantages of the invention without departing from the true scope of the invention. These and other obvious modifications are intended to be covered by the appended claims.

We claim:

1. A converter for reducing the amplitude of a DC input signal, the converter comprising:
    an input port for receiving the input signal;
    voltage reducing circuitry for reducing the amplitude of the input signal;
    an output port coupled to the voltage reducing circuitry for providing an output signal;
    a first switch coupled between the input port and voltage reducing circuitry and periodically switching between a closed position and an open position;
    a second switch coupled between the input port and the voltage reducing circuitry and periodically switching between a closed position and an open position,
    the first switch and the second switch being pulse width modulation switches,
    the first switch and the second switch being in parallel; and
    a switch controller for opening and closing the switches so that while the input signal is received at the input port, at least one of the first and second switches is open.

2. The converter as defined by claim 1 wherein the first switch has a first duty cycle and the second switch has a second duty cycle, the first duty cycle being about fifty percent, the second duty cycle being less than about fifty-one percent.

3. The converter as defined by claim 1 wherein the voltage reducing circuitry includes buck conversion circuitry.

4. The converter as defined by claim 3 wherein the buck conversion circuitry includes an inductor for receiving current from one of the first switch and the second switch.

5. The converter as defined by claim 1 further including an input port filter for filtering noise from the input signal.

6. The converter as defined by claim 1 further including an output port filter for filtering noise from the output signal.

7. The converter as defined by claim 1 wherein the switch includes a transistor.

8. A converter for reducing the amplitude of a DC input signal, the converter comprising:
    an input port for receiving the input signal;
    voltage reducing circuitry for reducing the amplitude of the input signal;
    an output port coupled to the voltage reducing circuitry for providing an output signal, the output signal having an amplitude that is less than the amplitude of the input signal;
    a first switch coupled between the input port and voltage reducing circuitry; and
    a second switch coupled in parallel with the first switch between the input port and the voltage reducing circuitry,
    the first switch and the second switch being pulse width modulation switches;
    the first switch having a first duty cycle, the second switch having a second duty cycle, the first duty cycle being out of phase with the second duty cycle.

9. The converter as defined by claim 8 wherein the first duty cycle is greater than about ninety degrees out of phase with the second duty cycle.

10. The converter as defined by claim 8 wherein the first duty cycle is about fifty percent and the second duty cycle each do not exceed about fifty percent.

11. The converter as defined by claim 8 wherein the voltage reducing circuitry includes buck conversion circuitry.

12. The converter as defined by claim 8 wherein the buck conversion circuitry includes an inductor for receiving current from one of the first switch and the second switch.

13. The converter as defined by claim 8 wherein the converter includes a converter duty cycle, the converter duty cycle being the sum of the duty cycles of the first duty cycle and the second duty cycle.

14. The converter as defined by claim 13 wherein the sum of the first duty cycle and the second duty cycle does not exceed one hundred percent.

15. The converter as defined by claim 1 wherein when closed and the input signal is received by the input, each of the first switch and second switch conduct current toward the output port.

* * * * *